United States Patent
Kobayashi et al.

(10) Patent No.: US 6,841,450 B2
(45) Date of Patent: Jan. 11, 2005

(54) ANNEALED WAFER MANUFACTURING METHOD AND ANNEALED WAFER

(75) Inventors: Norihiro Kobayashi, Annaka (JP); Masaro Tamatsuka, Annaka (JP); Takatoshi Nagoya, Annaka (JP); Wei Feig Qu, Annaka (JP); Makoto Iida, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/130,431
(22) PCT Filed: Sep. 18, 2001
(86) PCT No.: PCT/JP01/08097
§ 371 (c)(1),
(2), (4) Date: May 17, 2002
(87) PCT Pub. No.: WO02/25718
PCT Pub. Date: Mar. 28, 2002

(65) Prior Publication Data
US 2002/0173173 A1 Nov. 21, 2002

(30) Foreign Application Priority Data
Sep. 21, 2000 (JP) ........................................ 2000-287607

(51) Int. Cl.⁷ ............................................ H01L 21/336
(52) U.S. Cl. ...................................... 438/308; 438/455
(58) Field of Search ............................... 438/308, 455, 438/530; 257/347

(56) References Cited

U.S. PATENT DOCUMENTS 6,143,629 A * 11/2000 Sato ........................... 438/455
6,444,533 B1 * 9/2002 Lyding et al. .............. 438/308
6,492,682 B1 * 12/2002 Akiyama et al. ........... 257/347
2002/0020096 A1 * 2/2002 Dusink ........................ 40/792
2002/0160591 A1 * 10/2002 Akiyama et al. ........... 438/530

FOREIGN PATENT DOCUMENTS

| JP | 10-144697 | 5/1998 |
|----|-----------|--------|
| JP | 10-155698 | 5/1998 |
| JP | 2000-252225 | 9/2000 |

OTHER PUBLICATIONS

International Patent Search dated Dec. 18, 2001.

* cited by examiner

*Primary Examiner*—John F. Niebling
*Assistant Examiner*—Olivia T. Luk
(74) *Attorney, Agent, or Firm*—Rader, Fishman & Grauer PLLC

(57) ABSTRACT

The present invention provides an annealed wafer manufacturing method using a heat treatment method causing no change in resistivity of a wafer surface even when a silicon wafer having boron deposited on a surface thereof from an environment is subjected to heat treatment in an insert gas atmosphere and enabling the heat treatment in an ordinary diffusion furnace not requiring a sealed structure for increasing airtightness nor any specific facility such as explosion-proof facility. The present invention also provides an annealed wafer in which a boron concentration in the vicinity of a surface thereof is constant and crystal defects are annihilated. In the annealed wafer manufacturing method, a silicon wafer having a natural oxide film formed on a surface thereof with boron deposited thereon from an environment is subjected to heat treatment in an atmosphere containing hydrogen gas to remove the deposited boron before the natural oxide film is removed, and then is subjected to heat treatment in an inert gas atmosphere.

24 Claims, 3 Drawing Sheets

ANNEALED WAFER MANUFACTURING METHOD AND ANNEALED WAFER

TECHNICAL FIELD

The present invention relates to an annealed wafer manufacturing method enabling suppression of a change in resistivity due to an increase in a boron concentration in the vicinity of a surface of a wafer which is annealed in an atmosphere of 100% inert gases such as argon, and to a high quality annealed wafer manufactured by the manufacturing method having a constant boron concentration in the vicinity of the wafer surface with crystal defects being annihilated.

BACKGROUND ART

A silicon wafer (hereinafter may be simply referred to as a "wafer") is required to have no crystal defects in an active layer of a device from the viewpoint of device characteristics. To satisfy this requirement, there has been used an annealed wafer manufactured by annealing a wafer at a high temperature to reduce crystal defects. The wafer is, however, apt to be easily contaminated by boron present in an environment (in peripheral air) to which the silicon wafer is exposed. For instance, boron is released as a compound such as an oxide (hereinafter may be referred to as "deposited boron" or simply as "boron") from air filters used in a clean room, and the boron is deposited on a surface of a wafer left in the clean room.

When the wafer as described above is subjected to heat treatment with inert gases such as argon gas, boron deposited on the surface is not removed, and is diffused into the wafer to change resistivity in the vicinity of the wafer surface.

As a measure against boron present in an environment of a clean room, sometimes boron absorption filters or boronless filters are used for all air filters in the clean room, but it is necessary to frequently exchange the expensive filters with new ones, which results in a cost increase, and in addition even use of the filters as described above can not eliminate boron contamination completely.

On the other hand, when annealing is performed with hydrogen, boron dopant originally present inside the wafer easily outdiffuses, and further boron deposited on the surface evaporates or flies without diffusing into the wafer even by annealing, so that the boron concentration in the vicinity of the wafer surface decreases with the resistivity becoming problematically higher. To perform hydrogen treatment at a high temperature, a safeguard or the like is required to prevent explosion of hydrogen, which may raise such problems as a cost increase and a productivity decrease.

There is a method in which diluted hydrofluoric acid is used in the final stage of cleaning before annealing as proposed by the present applicant as a measure against boron contamination from such an environment (Japanese Patent Application No. 92155/2000). Although this method is extremely useful from the viewpoint of prevention of boron contamination, there is a problem with the method from the viewpoint of deposition of particles. Namely even if the final cleaning is performed with diluted hydrofluoric acid and then the wafer is cleaned with water, particles deposited in the diluted hydrofluoric acid are hardly cleaned down, and are carried up to the annealing step, so that, when the wafer is annealed, baking of the particles takes place to possibly cause a yield drop in fabrication of devices.

On the other hand, there has been proposed a method of reducing boron at an interface between an epitaxial layer and a bulk crystal in an epitaxial wafer (J. Robbins, A. J. Pidduck, J. L. Glasper, and I. M. Young, Appl. Phys. Lett. 55(12) 18 Sep. 1988). This method is characterized in that 100% hydrogen is used and the processing is performed in a depressurized state. Therefore, if it is tried to carry out the processing using an ordinary diffusion furnace, a safeguard for using hydrogen and facilities for performing the processing in a depressurized state are required, and therefore the method cannot be applied in a furnace not equipped with such facilities.

When an annealed wafer is manufactured in an atmosphere of hydrogen or inert gases represented by argon, generally a mirror-polished wafer to be annealed is prepared, contaminants such as heavy metals and organic materials deposited on the wafer surface are removed by wet cleaning and dried, and then the wafer is loaded into a heat treatment furnace.

When a mirror-polished silicon wafer is cleaned, a cleaning liquid (a chemical liquid) of various compositions is used, and a general cleaning method is of a proper combination of SC-1 (a liquid mixture of ammonia, hydrogen peroxide and water) cleaning, DHF (a diluted hydrofluoric acid aqueous solution) cleaning, and SC-2 (a liquid mixture of hydrogen chloride, hydrogen peroxide and water) cleaning, but when the DHF cleaning liquid is used as a cleaning liquid in the final stage of a sequence of cleaning steps, a natural oxide film on the wafer surface is removed with an active hydrophobic silicon surface being exposed, so that such troubles as deposition of particles or absorption of Cu, etc. easily occur.

Therefore, SC-1 or SC-2 is generally used in the final stage of the cleaning steps for the purpose to provide a hydrophilic wafer surface with a natural oxide film formed with the cleaning liquid thereon. This practice is also followed in wet cleaning performed before the wafer to be annealed is loaded into a heat treatment furnace, and after the wafer surface is finished to a hydrophilic one with a natural oxide film being formed thereon by cleaning, the wafer is loaded into a heat treatment furnace.

When the wafer is annealed in argon at a high temperature as described above, however, if boron has been deposited on the wafer before being subjected to annealing, the boron diffuses into the wafer by annealing with resistivity of the wafer surface being changed. When the resistivity of the wafer surface changes, in the case of, for instance, a MOS device, the on-off threshold voltage changes, which may not meet standard requirements. At the same time, various electric characteristics thereof also change.

In other words, when a wafer having boron deposited on a surface thereof is annealed in argon at a high temperature, crystal defects in the vicinity of the wafer surface are removed as in the case of annealing with hydrogen, so there is provided an advantage that the device characteristics are improved, but when the wafer surface is contaminated with boron, undesirable effects such as divergence of electric characteristics from the designed values occur, which may spoil a desirable improvement effect of the crystal quality in the vicinity of the wafer surface by annealing.

DISCLOSURE OF THE INVENTION

The present invention was made to solve the problems as described above, and it is an object of the present invention to provide an annealed wafer manufacturing method using a heat treatment method causing no change in resistivity of a wafer surface even when a silicon wafer having boron deposited on a surface thereof from an environment is subjected to heat treatment in an inert gas atmosphere and enabling the heat treatment in an ordinary diffusion furnace not requiring a sealed structure for increasing airtightness nor any specific facility such as an explosion-proof facility, and also to provide an annealed wafer in which a boron concentration in the vicinity of a surface thereof is constant and crystal defects are annihilated.

To achieve the object described above, an annealed wafer manufacturing method according to the present invention comprises the steps of: subjecting a silicon wafer having a natural oxide film formed on a surface thereof with boron deposited from an environment to heat treatment (first heat treatment) in an atmosphere containing hydrogen gas, thereby the deposited boron being removed before the natural oxide film is removed; and subjecting the wafer to heat treatment (second heat treatment) in an inert gas atmosphere.

As described later, boron deposited on a surface of a wafer from an environment hardly diffuses into the wafer when a natural oxide film is present on the wafer surface. Therefore, when the second heat treatment is performed after the deposited boron is removed by making use of the effect by hydrogen gas in the state where the natural oxide film is present, it is possible to prevent a resistivity change in the vicinity of the wafer surface due to the second heat treatment. In this case, if the hydrogen gas concentration in the first heat treatment is equal to or lower than a lower explosion limit thereof (about 4%), the sealed structure for increasing airtightness in a heat treatment furnace or an explosion-proof facility as a measure at the time of the explosion is not required, and an atmospheric pressure furnace can be used, which is advantageous in safety as well as cost. It should be noted that the sufficient effect may not be expected when the hydrogen concentration is less than 0.1%.

When the first heat treatment is performed in a mixed gas atmosphere of hydrogen gas having a concentration equal to or lower than the lower explosion limit thereof and argon gas, the deposited boron is removed due to the effect of the hydrogen gas and at the same time the natural oxide film is removed due to the effect of the argon gas, so that it is necessary to remove the deposited boron before the natural oxide film is completely removed. For that purpose, requirements for the first heat treatment should be preferably in the heat treatment temperature range of 900 to 1100° C., and in the heat treatment time range of 5 to 60 minutes.

It should be noted that the first heat treatment as described above can be performed as a temperature raising process in the second heat treatment. The annealed wafer manufactured by the annealed wafer manufacturing method as described above is a high quality annealed wafer in which a boron concentration in the vicinity of the wafer surface is constant and crystal defects are annihilated.

On the other hand, the second heat treatment is to annihilate crystal defects in the vicinity of the wafer surface, and is performed in an inert gas atmosphere in the temperature range of 1100 to 1300° C. It should be noted that the inert gas atmosphere used in the present invention includes atmospheres of a 100% inert gas such as argon and a mixture of an inert gas and hydrogen gas having a concentration equal to or lower than the lower explosion limit thereof.

The process of the inventive activities of the present inventors concerning the present invention is described in detail below.

Taking into consideration the difficulty of completely eliminating boron contamination from an environment, the present inventors have examined heat treatment methods not affecting resistivity of an annealed wafer even when boron is deposited on a surface thereof, and as a result of the examination the present invention has been completed aiming at the fact that heat treatment in argon gas and that in hydrogen gas are opposite to each other in terms of increase and decrease of resistivity of a wafer surface.

Namely the present inventors conceived that a high quality annealed wafer could be obtained by evaporating boron deposited on a wafer surface by means of heat treatment with hydrogen gas and then subjecting the wafer to the heat treatment for annihilating crystal defects with argon gas without changing resistivity in the vicinity of the wafer surface.

To perform annealing with hydrogen gas, however, a sealed structure for increasing airtightness in a heat treatment furnace or a measure at the time of the explosion is required as described above, which is disadvantageous in cost.

Then the present inventors carried out the experiments described below to confirm whether it is possible or not to remove the deposited boron by using argon gas atmosphere containing hydrogen gas of a concentration equal to or lower than the lower explosion limit thereof as a heat treatment atmosphere for removing the deposited boron. As a result, the present inventors newly discovered the phenomenon that, only when a heat treatment temperature in the argon gas atmosphere containing the hydrogen gas of a concentration equal to or lower than the lower explosion limit thereof is set to a specific temperature range as shown in FIG. 4 (the temperature range of 900 to 1100° C., and preferably 950 to 1050° C. as shown in FIG. 4), the resistivity of the original wafer is maintained.

This phenomenon can be considered as described below. If a silicon wafer having a natural oxide film formed on a surface thereof with boron deposited from an environment is subjected to heat treatment (first heat treatment) in a mixed gas atmosphere of hydrogen and argon, when the heat treatment temperature is low, removal of the deposited boron by evaporation or flying is not sufficient, so that the deposited boron diffuses into the wafer with the subsequent high temperature heat treatment in argon atmosphere and then resistivity in the vicinity of the wafer surface drops.

On the other hand, when a heat treatment temperature of the first heat treatment is higher than 1100° C., and, more strictly speaking, higher than 1050° C., as the etching rate to the natural oxide film becomes extremely large due to the effect of the argon gas in the mixed gas, the natural oxide film is removed before the boron deposited on the surface is removed. It can be considered that, as a result, the deposited boron becomes easier to diffuse into the wafer, or reacts with a silicon atom to form a compound and become harder to be removed, and then diffuses into the wafer by the subsequent heat treatment in the argon atmosphere with resistivity thereof being dropped.

In contrast, it is supposed that, when the first heat treatment is performed in the temperature range of 900° C. to 1100° C., preferably 950° C. to 1050° C., an etching rate to the natural oxide film is not so high, so that the deposited boron is removed by evaporation or flying before the natural oxide film is removed; therefore the deposited boron is not present at all on the wafer surface in the subsequent heat treatment in the argon atmosphere, resistivity thereof being not changed.

As understood from the reasoning above, an appropriate heat treatment temperature and a heat treatment time of the first heat treatment are parameters dependent on a thickness of a natural oxide film or a quantity of deposited boron on a wafer, and in addition, the thickness of the natural oxide film and the quantity of the deposited boron change according to cleaning conditions, a left time of the wafer in an environment or the like before the heat treatment, so that the parameters can not be decided easily. When deciding these parameters, it should be required to set cleaning conditions, a left time of the wafer, and heat treatment conditions after the first heat treatment on the basis of an actual annealed wafer manufacturing process, and then to experimentally set conditions for the first heat treatment causing no change in resistivity after the heat treatment.

In the experiment described below as an example, even when the first heat treatment was performed in the temperature range of 950 to 1050° C., resistivity of the silicon wafer did not change, and at the temperatures of 900° C. or 1100° C., the resistivity changed only a little, and therefore it can be considered that, when the first heat treatment is performed in the temperature range of 900 to 1100° C., a resistivity change of a wafer can be prevented by adjusting the heat treatment time in the range of the order of 5 to 60 minutes.

BEST MODE FOR CARRYING OUT THE INVENTION

Embodiments of the present invention are described below with reference to FIG. 1 and FIG. 2 each showing an example of a heat treatment sequence in the method according to the present invention. It is needless to say that various modifications other than those shown in the figures are possible without departing from the technical idea of the present invention.

As a wafer to be subjected to heat treatment, there is used one which is subjected to standard cleaning to form a natural oxide film of several to several tens angstroms in thickness on a surface thereof and is contaminated with boron deposited from an environment. Argon gas is preferable as an insert gas to be used, but other gases such as helium, neon, krypton, or a mixture thereof may be used.

Figure 1:
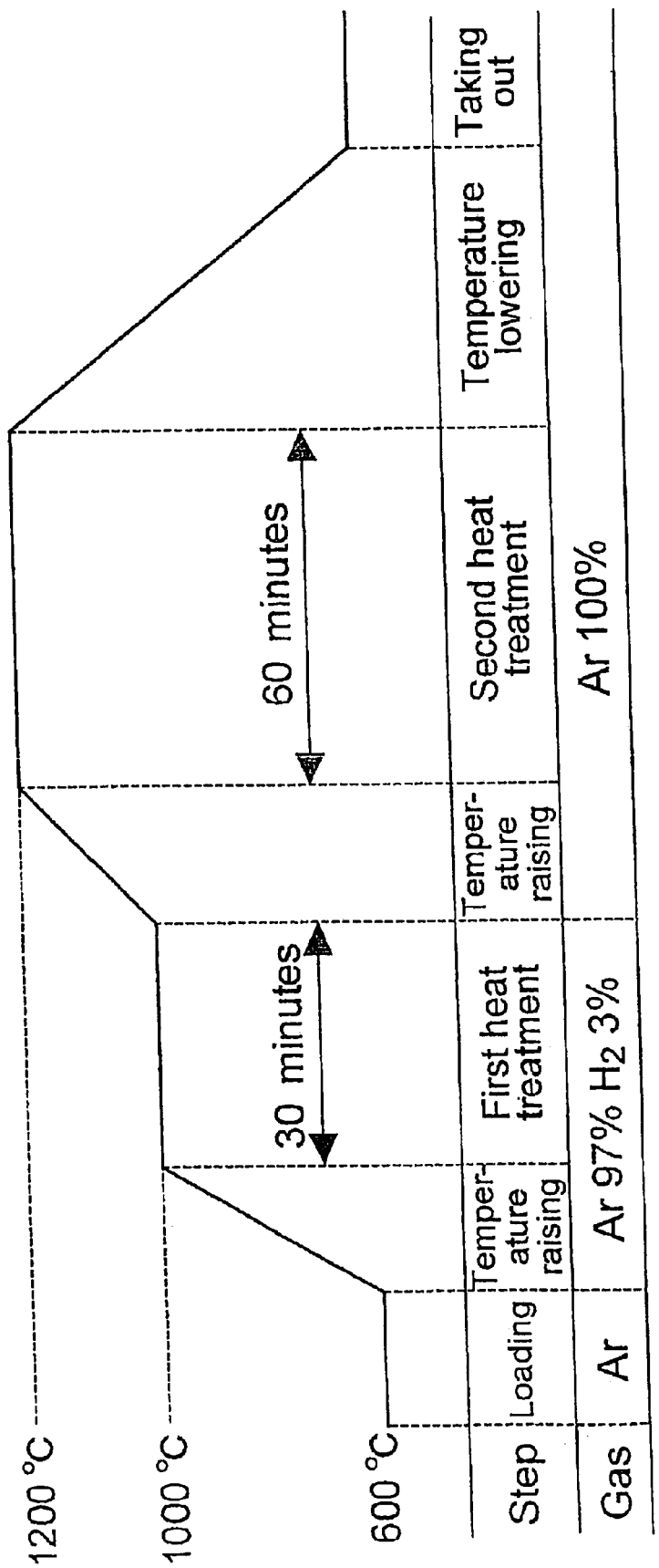
FIG. 1 is a time chart showing an example of a heat treatment sequence in an annealed wafer manufacturing method according to the present invention.

FIG. 1 is a time chart showing an example of a heat treatment sequence in the method according to the present invention in a state in which treatment temperatures, treatment steps, and atmospheric gases are illustrated separately. The figure shows a case where the first heat treatment is performed keeping the temperature at a constant level (1000° C.). The heat treatment sequence shown in FIG. 1 is as described below.

① After a wafer is loaded into a heat treatment furnace at the temperature of 600° C., the furnace is purged with argon gas (Loading step in FIG. 1). Any inert gas may be used as the atmospheric gas, but argon gas is preferable.

② Hydrogen gas is added to the argon gas at the flow rate ratio of 3%, and the temperature is raised from 600° C. to 1000° C. (Temperature raising step). An added quantity of the hydrogen gas is preferably equal to or lower than the lower explosion limit thereof(about 4%) and 0.1% or higher. When the concentration of the hydrogen gas is in this range, it is not necessary to provide an explosion-proof facility, and an atmospheric pressure furnace can be used, which is advantageous in cost and safety. The temperature should be raised up to the first heat treatment temperature(900° C. to 1100° C.).

③ The wafer is stayed in the heat treatment furnace for 30 minutes with the above-described atmosphere (97% Ar+3% $H_2$) at 1000° C. (First heat treatment step). This first heat treatment is performed to remove boron deposited from an environment from a surface of the wafer, and the heat treatment is preferably performed for 5 to 60 minutes in the hydrogen-containing atmosphere in the range of 900° C. to 1100° C. Namely in this temperature range, if the heat treatment time is less than 5 minutes, removal of boron may be insufficient, but if the heat treatment time is about 60 minutes, almost all boron contamination can fully be removed.

④ Addition of the hydrogen gas in the above-described atmosphere is stopped, so that the atmosphere is changed to a 100% argon gas atmosphere and the temperature is raised from 1000° C. to 1200° C. (Temperature raising step). The temperature should be raised to the second heat treatment temperature (about 1200° C.). The second heat treatment may be performed without stopping addition of the hydrogen gas in the first heat treatment.

⑤ The wafer is stayed in the heat treatment furnace with the above-described atmosphere (100% Ar or Ar+an extremely small quantity of $H_2$) for 60 minutes at 1200° C. (Second heat treatment step). This second heat treatment is performed to annihilate crystal defects of the wafer, and may be performed for 30 minutes to 5 hours in the temperature range of the order of 1100 to 1300° C. as conventional.

⑥ The temperature is lowered from 1200° C. to 600° C. (Temperature lowering step), and then the wafer is taken out from the heat treatment furnace (Taking out step).

Figure 2:
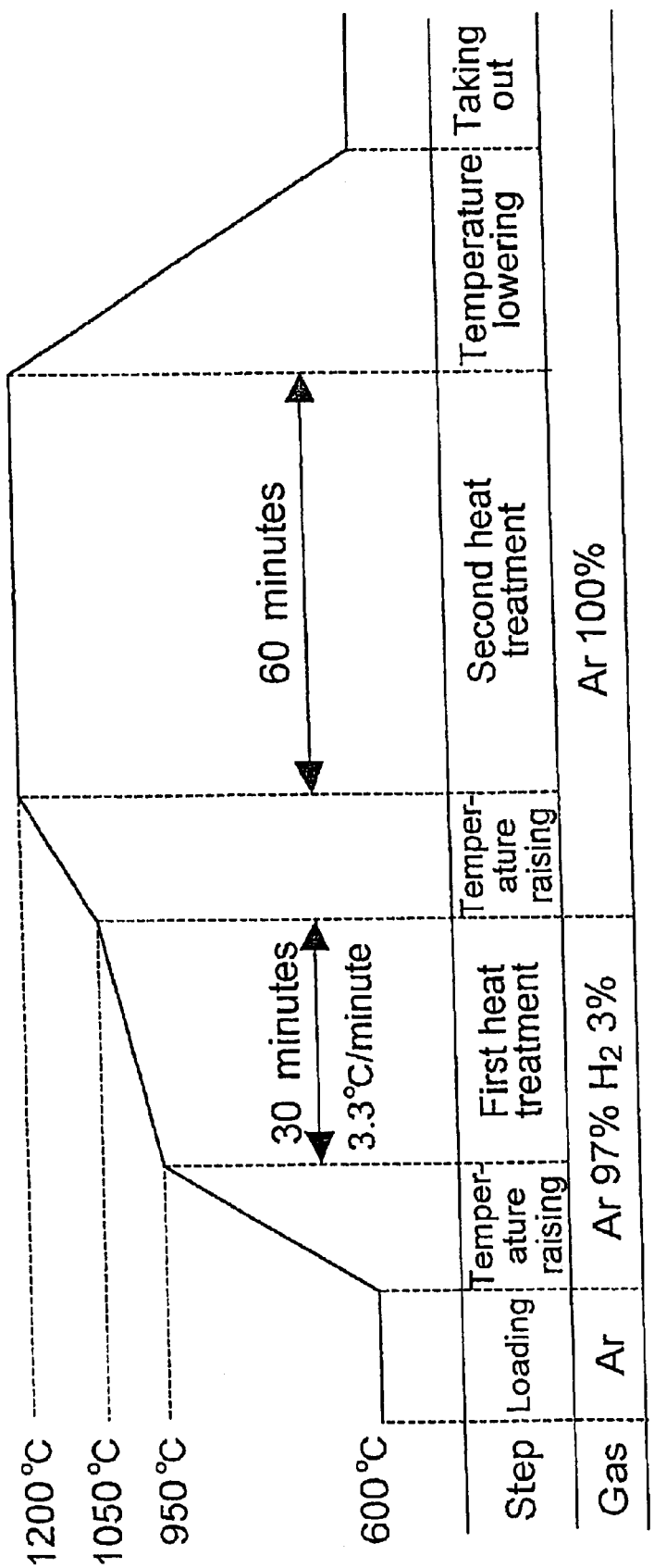
FIG. 2 is a time chart showing another example of a heat treatment sequence in an annealed wafer manufacturing method according to the present invention.

FIG. 2 is a time chart similar to FIG. 1, showing another example of the heat treatment sequence in the method according to the present invention. The figure shows a case where the first heat treatment is performed while raising the temperature (from 950° C. to 1050° C.). The heat treatment sequence shown in FIG. 2 is different from that in FIG. 1 only in the points that the temperature is raised from 600° C. to 950° C. in the temperature raising step ② in FIG. 1, and that, instead of keeping the temperature at a constant level (1000° C.) in the first heat treatment step ③ in FIG. 1, the first heat treatment is performed while raising the temperature from 950° C. to 1050° C. (at the temperature raising rate of 3.3° C./minute), and other steps and conditions are the same as those described above, so that second description thereof is omitted.

In the heat treatment sequence shown in FIG. 2, the first heat treatment is performed as a temperature raising process in the second heat treatment, and in this case, it is advantageous that the temperature can efficiently and quickly be raised to the heat treatment temperature of the second heat treatment. It should be noted that the temperature raising rate in the first heat treatment may be set so that the heat treatment can be performed for 5 to 60 minutes in the temperature range of 950 to 1050° C.

EXAMPLES

The present invention is described in further details with reference to an experimental example.

Experimental Example 1

After silicon wafers each having a diameter of 150 mm, a conductivity type of p-type, a crystal axis orientation of <100>, and resistivity of 10 Ω·cm were cleaned according to the standard cleaning (SC-1, SC-2 and SC-1), the wafers were left for 24 hours in a clean room. Boron deposited on the wafers was recovered into a solution by a vapor phase decomposition method, and the solution was measured by atomic absorption spectroscopy to calculate a quantity of deposited boron.

Figure 3:
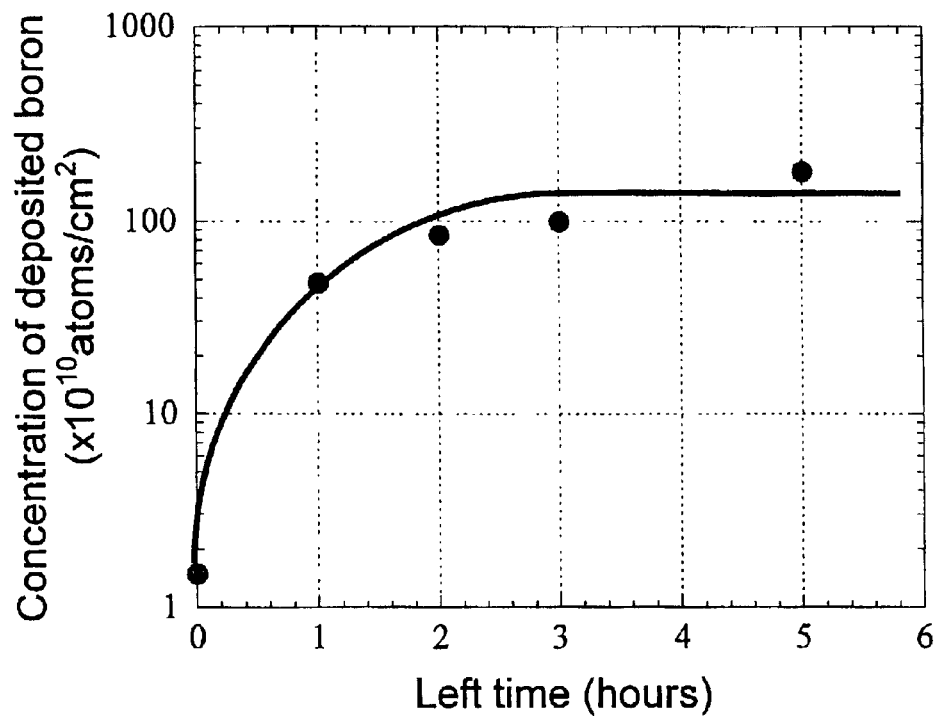
FIG. 3 is a graph showing the relationship between a left time and a concentration of deposited boron in terms of a wafer which is left in a clean room in Experimental Example 1.

As a result, it was found that a quantity of boron deposited on the wafer left in the clean room was saturated when the left time is three hours or more (see FIG. 3). Thus the left time in the clean room after cleaning the wafer was set to three hours; a plurality of wafers each left for three hours was prepared, and the wafers were subjected to heat treatment. This heat treatment sequence was the same as that consisting of the steps ① to ⑥ shown in FIG. 1 excluding the point that the temperature of the first heat treatment was set to various temperatures in the range of 700 to 1200° C. as shown in FIG. 4, so second description of the specific procedures and conditions thereof is omitted.

Figure 4:
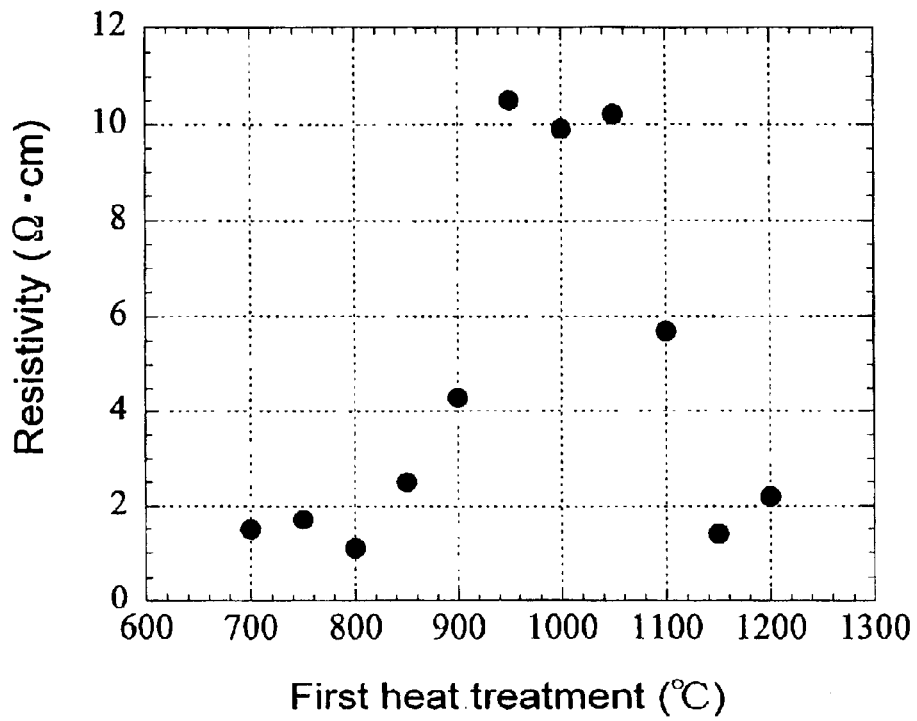
FIG. 4 is a graph showing the relationship between resistivity of a surface of a wafer having been subjected to heat treatment and a first heat treatment temperature in Experimental Example 1.

Resistivity of a surface of the wafer having been subjected to the heat treatment following the steps ① to ⑥ above was measured with a SCP (Surface Charge Profiler), and the result is shown in FIG. 4. From the result shown in FIG. 4, it is revealed that the resistivity peak of the wafer is equivalent to that of the original wafer when the temperature of the first heat treatment is in the range of 950 to 1050° C., that the resistivity change is small when the temperature of the first heat treatment is 900° C. or 1100° C., and that the resistivity drops in comparison with that of the original wafer at other temperatures (namely, that boron deposited on the surface diffuses into the wafer).

It was also confirmed that in all of the annealed wafers subjected to the above heat treatment crystal defects are annihilated, and that the performance of the first heat treatment did not give any effect on annihilation of crystal defects.

Resistivity of the same sample as that used in this experimental example above was measured by secondary ion mass spectroscopy (SIMS) and C-V measurement, and similar results were obtained. Therefore, it was found out that, when the temperature of the first heat treatment is in the range of the order of 900 to 1100° C., a resistivity change of a wafer can effectively be prevented by controlling a heat treatment time in the range of 5 to 60 minutes.

Capability of Exploitation in Industry:

With the annealed wafer manufacturing method according to the present invention, it is possible to provide a remarkable effect that, even when a silicon wafer having boron deposited on a surface thereof from an environment is subjected to heat treatment in an inert gas atmosphere, there is no occurrence of a resistivity change of the wafer surface. Further the heat treatment by the method according to the present invention can be performed in an ordinary diffusion furnace not requiring a sealed structure for increasing air-tightness nor any specific facility such as an explosion-proof facility, and therefore a relatively cheap heat treatment furnace can be used, which is substantially advantageous in cost.

Further the annealed wafer according to the present invention is of high quality and has a constant boron concentration in the vicinity of a wafer surface with crystal defects being annihilated, and is preferably used for fabricating devices with excellent characteristics.

What is claimed is:

1. An annealed wafer manufacturing method comprising the steps of:
   subjecting a silicon wafer having a natural oxide film formed on a surface thereof with boron deposited from an environment to heat treatment in an atmosphere containing hydrogen gas, thereby the deposited boron being removed before the natural oxide film is removed; and
   subjecting the wafer to heat treatment in an inert gas atmosphere.

2. An annealed wafer manufacturing method according to claim 1, wherein the inert gas is argon gas.

3. An annealed wafer manufacturing method according to claim 1, wherein the atmosphere containing the hydrogen gas is a mixed gas atmosphere of hydrogen gas having a concentration equal to or lower than a lower explosion limit thereof and argon gas.

4. An annealed wafer manufacturing method according to claim 2, wherein the atmosphere containing the hydrogen gas is a mixed gas atmosphere of hydrogen gas having a concentration equal to or lower than a lower explosion limit thereof and argon gas.

5. An annealed wafer manufacturing method according to claim 3, wherein the heat treatment in the atmosphere containing the hydrogen gas is performed for 5 to 60 minutes in the temperature range of 900 to 1100° C.

6. An annealed wafer manufacturing method according to claim 4, wherein the heat treatment in the atmosphere containing the hydrogen gas is performed for 5 to 60 minutes in the temperature range of 900 to 1100° C.

7. An annealed wafer manufacturing method according to claim 1, wherein the heat treatment in the atmosphere containing the hydrogen gas is performed while raising the temperature.

8. An annealed wafer manufacturing method according to claim 2, wherein the heat treatment in the atmosphere containing the hydrogen gas is performed while raising the temperature.

9. An annealed wafer manufacturing method according to claim 3, wherein the heat treatment in the atmosphere containing the hydrogen gas is performed while raising the temperature.

10. An annealed wafer manufacturing method according to claim 4, wherein the heat treatment in the atmosphere containing the hydrogen gas is performed while raising the temperature.

11. An annealed wafer manufacturing method according to claim 5, wherein the heat treatment in the atmosphere containing the hydrogen gas is performed while raising the temperature.

12. An annealed wafer manufacturing method according to claim 6, wherein the heat treatment in the atmosphere containing the hydrogen gas is performed while raising the temperature.

13. An annealed wafer manufactured by the manufacturing method according to claim 1, wherein a boron concentration in the vicinity of a wafer surface is constant and crystal defects are annihilated.

14. An annealed wafer manufactured by the manufacturing method according to claim 2, wherein a boron concentration in the vicinity of a wafer surface is constant and crystal defects are annihilated.

15. An annealed wafer manufactured by the manufacturing method according to claim 3, wherein a boron concentration in the vicinity of a wafer surface is constant and crystal defects are annihilated.

16. An annealed wafer manufactured by the manufacturing method according to claim 4, wherein a baron concentration in the vicinity of a wafer surface is constant and crystal defects are annihilated.

17. An annealed wafer manufactured by the manufacturing method according to claim 5, wherein a boron concentration in the vicinity of a wafer surface is constant and crystal defects are annihilated.

18. An annealed wafer manufactured by the manufacturing method according to claim 6, wherein a boron concentration in the vicinity of a wafer surface is constant and crystal defects are annihilated.

19. An annealed wafer manufactured by the manufacturing method according to claim 7, wherein a boron concentration in the vicinity of a wafer surface is constant and crystal defects are annihilated.

20. An annealed wafer manufactured by the manufacturing method according to claim 8, wherein a boron concentration in the vicinity of a wafer surface is constant and crystal detects are annihilated.

21. An annealed wafer manufactured by the manufacturing method according to claim 9, wherein a boron concentration in the vicinity of a wafer surface is constant and crystal defects are annihilated.

22. An annealed wafer manufactured by the manufacturing method according to claim 10, wherein a boron concentration in the vicinity of a wafer surface is constant and crystal defects are annihilated.

23. An annealed wafer manufactured by the manufacturing method according to claim 11, wherein a boron concentration in the vicinity of a wafer surface is constant and crystal defects are annihilated.

24. An annealed wafer manufactured by the manufacturing method according to claim 12, wherein a boron concentration in the vicinity of a wafer surface is constant and crystal defects are annihilated.

* * * * *